(12) United States Patent
Redline et al.

(10) Patent No.: US 6,773,757 B1
(45) Date of Patent: Aug. 10, 2004

(54) COATING FOR SILVER PLATED CIRCUITS

(76) Inventors: Ronald Redline, 28 Platt Dr., Prospect, CT (US) 06712; David Angelone, 62 Pierpont Rd., Waterbury, CT (US) 06705; Steven A. Castaldi, 134 Farmstead Ave., Torrington, CT (US) 06790; Lenora M Toscano, 489 Wolcott St., Bristol, CT (US) 06010

( * ) Notice: Subject to any disclaimer, the term of this patent is extended or adjusted under 35 U.S.C. 154(b) by 0 days.

(21) Appl. No.: 10/412,932

(22) Filed: Apr. 14, 2003

(51) Int. Cl.[7] ............................. B05D 1/36; B05D 3/10; B05D 1/18
(52) U.S. Cl. ................... 427/404; 427/405; 427/407.1; 427/409; 427/343; 427/436; 427/437
(58) Field of Search ................................. 427/404, 405, 427/407.1, 409, 343, 436, 437

(56) References Cited

U.S. PATENT DOCUMENTS

| | | | |
|---|---|---|---|
| 4,940,181 A | | 7/1990 | Juskey, Jr. et al. |
| 4,978,423 A | | 12/1990 | Durnwirth, Jr. et al. |
| 5,160,579 A | | 11/1992 | Larson |
| 5,173,130 A | | 12/1992 | Kinoshita et al. |
| 5,235,139 A | | 8/1993 | Bengston et al. |
| 5,301,253 A | * | 4/1994 | Goodman ................... 385/128 |
| 5,480,576 A | * | 1/1996 | Gary et al. .................. 510/220 |
| 5,567,357 A | | 10/1996 | Wakita |
| 5,662,168 A | * | 9/1997 | Smith .......................... 166/295 |
| 5,733,599 A | | 3/1998 | Ferrier et al. |
| 5,935,640 A | | 8/1999 | Ferrier et al. |
| 6,183,545 B1 | | 2/2001 | Okuhama et al. |
| 6,200,451 B1 | | 3/2001 | Redline et al. |
| 6,344,157 B1 | * | 2/2002 | Cheng et al. ................ 252/512 |
| 6,375,822 B1 | | 4/2002 | Taytsas |
| 6,444,109 B1 | | 9/2002 | Redline et al. |
| 6,544,397 B2 | | 4/2003 | Redline et al. |
| 2003/0207974 A1 | * | 11/2003 | Kubik et al. ................. 524/430 |

FOREIGN PATENT DOCUMENTS

| | | | |
|---|---|---|---|
| EP | 0797380 A1 | | 9/1997 |
| WO | WO 96/17974 | | 6/1996 |
| WO | WO 96/17975 | * | 6/1996 |

* cited by examiner

*Primary Examiner*—Michael Barr
(74) *Attorney, Agent, or Firm*—Carmody & Torrance LLP

(57) ABSTRACT

A method for enhancing the solderability of a metallic surface is disclosed where the metallic surface is plated with an immersion or electroless silver plate prior to soldering, after which immersion silver plate is treated with an alkaline polymer coating comprising aqueous vinyl polymers, aqueous acrylic polymers, anti-fungal agents and a benzotriazole or benzimidazole compound to produce a deposit that is resistant to electromigration and that provides an anti-tarnish and anti-corrosion coating on the surface.

10 Claims, No Drawings

COATING FOR SILVER PLATED CIRCUITS

FIELD OF THE INVENTION

This invention relates generally to a method of treating a surface with a solution that enhances the solderability of the surface and, more importantly, acts as an anti-tarnish or anti-corrosion agent for the surface. The method is particularly useful in the fabrication and assembly of printed circuit boards.

BACKGROUND OF THE INVENTION

Soldering is generally used for making mechanical, electromechanical, or electronic connections to a variety of articles. The distinction between expected functions of the joints is important because each application has its own specific requirements for surface preparation. Of the three soldering applications, making electronic connections is the most demanding.

In the manufacture of electronic equipment utilizing printed circuits, connections of electronic components to the printed circuits are made by soldering of the leads of the components to the through-holes, surrounding pads, lands and other points of connection (collectively, "Areas of Connection"). Typically the connection occurs by wave soldering techniques.

To facilitate this soldering operation, the printed circuit fabricator is required to arrange that the through-holes, pads, lands and other points of connection are receptive to the subsequent soldering processes. Thus these surfaces must be readily wettable by the solder and permit an integral conductive connection with the leads or surfaces of the electronic components. Because of these needs, printed circuit fabricators have devised various methods of preserving and enhancing the solderability of surfaces.

One means of arranging good solderability of the surfaces in question is to provide the surfaces with a pre-coating of solder. This is typically performed by a process called hot air solder leveling or through some type of plating process. In printed circuit fabrication, however, this method has several drawbacks. The use of hot air solder leveling may cause unacceptably high rate of defects due to shorts, particularly when dealing with small circuits. If plating is used, since it is not easy to selectively provide these areas with solder, all conductive areas of the board must be solder plated causing severe problems with the subsequent application of solder mask. In addition, the foregoing processes are inefficient and relatively expensive.

Another means of arranging good solderability of these surfaces is to plate them with a final finish coating of a precious metal such as gold, palladium or rhodium. U.S. Pat. No. 5,235,139 (Bengston, et. al.), the teachings of which are incorporated herein by reference, proposes a method for achieving this previous metal final finish. Bengston et. al. propose plating the copper areas to be soldered with electroless nickel-boron, followed by a precious metal coating such as gold. See also U.S. Pat. No. 4,940,181 to Juskey, Jr. et al., the teachings of which are incorporated herein by reference for a similar process which teaches the plating of electroless copper, followed by electrolytic copper, followed by nickel followed by gold as a solderable surface. These processes work well but are time consuming and expensive.

Various attempts have been made to selectively apply solder to the necessary areas only. One such method, described in U.S. Pat. No. 4,978,423 to Durnwith et. al., the teachings of which are herein incorporated by reference, involves use of organic etch resists over the solder plated areas of connection followed by selective stripping of tin-lead from the copper traces before application of the solder mask. See also U.S. Pat. No. 5,160,579 to Larson, the teachings of which are incorporated herein by reference, for other known selective solder processes.

Soldering directly to copper surfaces has been difficult and inconsistent. These problems are due mainly to the inability of keeping the copper surfaces clean and free of oxidation throughout the soldering operation. Various organic treatments have been developed to preserve copper surfaces in a readily solderable state. For example, see U.S. Pat. No. 5,173,130 (Kinoshita) which teaches the use of certain 2-alkylbenzimidazoles as copper pre-fluxes to preserve the solderability of the copper surfaces. Treatments such as those taught in Kinoshita have proven successful, but there is still need to improve the reliability of the process.

The method of preserving solderability proposed herein is the coating of copper surfaces to be soldered with an immersion or electroless silver plate prior to soldering. It has been found, however, that when the foregoing method is used, the silver coating has a tendency to develop outgrowths or filaments via an electromigration mechanism when the circuits are being used (i.e. with voltage potentials present) in the presence of moisture.

The tendency for electromigration to occur can be measured by a standard technique specified in Bellcore GR-78-CORE (13.2.5, 13.2.7) standard test procedures which are incorporated herein by reference in their entirety. The foregoing Bellcore procedure measures the average insulation resistance between circuit features. Bellcore and IPC standards require that the average insulation resistance not decrease by more than one decade between the initial value (obtained after a conditioning period of 96 hours at 85° C./85% relative humidity with no bias) and the final value (obtained after an additional 500 hours at 85° C./85% relative humidity with a 10 V.dc bias applied).

One method which may be used to overcome the electromigration of silver plating is to coat the silver plate with another more noble metal such as gold. The disadvantages of this method are the expense of gold plating as well as the necessity for additional process steps.

Another method which may be used to overcome the electromigration of immersion silver plating is described in U.S. Pat. No. 6,444,109 to Kukanskis, the teachings of which are herein incorporated by reference. In this method, the immersion silver plate is treated with an additive selected from the group consisting of fatty amines, fatty amides, quaternary salts, amphoteric salts, resinous amines, resinous amides, fatty acids, resinous acids, ethoxylated derivatives of any of the foregoing, and mixtures of any of the foregoing.

It is an object of this invention to propose a method for preserving and enhancing the solderability of copper surfaces by plating said copper surface with a novel silver plate which is more resistant to electromigration than prior art silver deposits. It is a further objection of the invention to increase migration resistance of the silver plating as well as to provide tarnish or corrosion resistance of the silver plating by adding a polymer solution to the silver plating bath or by using the polymer solution as a post dip treatment.

SUMMARY OF THE INVENTION

The current invention proposes the use of an immersion or electroless silver coating as an improved solderability preservative for various surfaces, particularly copper surfaces. Preferred compositions for depositing the immersion silver coating are also disclosed. The novel silver plating process produces a silver plate, which is more resistant to electromigration than conventional silver deposits. The process proposed is a versatile, low cost method for effectively preserving the solderability of surfaces, particularly copper surfaces and areas of connection on printed circuit boards.

In addition, the current invention proposes to increase the migration resistance as well as the tarnish or corrosion resistance of the silver plating material by using a polymer solution as a post dip on the silver plated surface.

DETAILED DESCRIPTION OF THE INVENTION

The current invention proposes a process for preserving and enhancing the solderability of a metal surface, particularly copper surfaces. The proposed process comprises the following steps:

a). Cleaning the metal surface;

b). optionally, etching the metal surface;

c). treating the metal surface with a silver plating solution, said solution comprising:
  1. a soluble source of silver ions;
  2. an acid;
  3. optionally, an additive selected from the group consisting of fatty amines, fatty amides, quaternary salts, amphoteric salts, resinous amines, resinous amides, fatty acids, resinous acids, and mixtures of the foregoing;
  4. optionally, an imidazole, benzimidazole, or imidazole derivative or triazole derivative;
  5. optionally, an oxidant; and d.) treating the immersion silver plated surface with a solution comprising a material selected from the group consisting of aqueous vinyl polymers or copolymers, aqueous acrylic polymers or copolymers, and mixtures of the foregoing, and optionally a compound selected from the group consisting of triazoles, imidazoles, and derivatives thereof.

It has been discovered that immersion or electroless silver deposits provide excellent solderability preservatives, which are particularly useful in the fabrication of printed circuit boards. The solderability achievable with a simple or electroless immersion silver deposit in printed circuit applications has unexpectedly been found to exceed that achievable with prior art nickel-gold plating processes such as described in U.S. Pat. No. 5,235,139 and unexpectedly exceeds that achievable with other immersion deposits. As can be seen in the examples to follow, the processes of the current invention yield surfaces which are extremely solderable under adverse conditions. In printed circuit applications, the surfaces are wire bondable.

Immersion plating is a process which results from a replacement reaction whereby the surface being plated dissolves into solution and at the same time the metal being plated deposits from the plating solution onto the surface. The immersion plating initiates without prior activation of the surfaces. The metal to be plated is generally more noble than the surface metal. Thus immersion plating is usually significantly easier to control and significantly more cost effective than electroless plating, which requires sophisticated auto-catalytic plating solutions and processes for activation of the surfaces prior to plating. Electroless plating, as the name implys, is a plating process which usually uses a chemical reducing agent to reduce the plated metal from solution onto the surface to be plated. Depending upon the nature of the plated metal and the surface to be plated, activation of the surface using a catalyst may be required.

The soluble source of silver ions can be derived from a variety of silver compounds. Silver nitrate has been found to be most preferable. The concentration of silver in the plating solution can range from 0.1 to 25 grams per liter, but is most preferably present in a concentration of 0.5 to 2 grams per liter.

Although a variety of acids are suitable for use in this formulation, methane sulfonic acid or nitric acid is most preferred. The concentration of acid in the plating solution can range from 1 to 150 grams per liter but is preferably in the range of 5 to 50 grams per liter.

The inclusion of imidazoles in the silver plating solution provides significant advantages in plating solutions in general, but is particularly useful and advantageous in immersion or electroless silver plating. The inventors have found that silver deposits resulting from plating baths containing imidazoles are brighter, smoother and more cohesive than silver deposits plated from baths which do not have imidazoles. In addition the plating baths with imidazoles have longer effective lives than comparable baths without imidazoles. Examples of suitable imidazoles and imidazole derivatives that may be used are discussed in U.S. Pat. No. 6,444,109.

The plating solution may, optionally, advantageously also contain an oxidant. Nitro aromatic compounds most preferably dinitro compounds, such as 3,5 dinitrohydroxybenzoic acid are preferred in this regard. The concentration of such an oxidant in the solution can range from 0.1 to 25 grams per liter, but is preferably from 0.5 to 2 grams per liter.

Additives selected from the group consisting of fatty amines, fatty acids, fatty amides, quaternary salts, amphoteric salts, resinous amines, resinous amides, resinous acids and mixtures of the foregoing may optionally be used to further prevent or significantly reduce the tendency for the silver plate to electromigrate. Examples of suitable additives are discussed in U.S. Pat. No. 6,444,109. If used, the concentration of the foregoing additives in the immersion silver plating bath may range from 0.1 to 15 grams per liter but is preferably from 1 to 5 grams per liter. Incorporation of the additives into the plating bath itself is the preferred method.

In order to prevent or significantly reduce the tendency for immersion silver plates to electromigrate, as well as to provide tarnish and corrosion protection, the inventors have found that the provision of a polymer solution onto the plated deposit provides beneficial results. The polymer solution generally comprises one or more aqueous vinyl polymers or copolymers, and/or one or more aqueous acrylic polymers or copolymers, as well as preferably an anti-fungal agent, and a triazole or imidazole-type compound. Preferably the polymer coating solution is applied in a subsequent treatment step.

Suitable aqueous vinyl polymers include UCAR® vinyl resin dispersions, such as UCAR® Aw-875, available from Union Carbide-Dow. Another suitable aqueous vinyl copolymer is available from Allied Colloids Limited under the tradename DP6-4586™. The aqueous vinyl polymer or copolymer is generally present in the polymer solution in an amount of 20–50 percent by weight, but preferably is present at 30–45 percent by weight. Preferably the vinyl polymers or copolymers have a Tg of 40–100° C., molecular weight from 2,000 to 50,000, acid value from 45–100 and pH from 7–9.

Suitable aqueous acrylic polymers include Joncryl® 142 available from Johnson Chemicals and MONCRYL® 350 available from Morton Chemicals. Other suitable aqueous acrylic copolymers are available from Allied Colloids Limited under the tradename Glascol™ H and P. The aqueous acrylic polymer is generally present in the polymer solution in an amount of about 5–30 percent by weight, but is preferably present at 30–45 percent by weight. Preferably the acrylic polymers or copolymers have a Tg of 0–80° C., a molecular weight from 1,000 to 50,000 and a pH of 7–9.

An anti-fungal agent is preferably used and is preferably isothiazole or 1,2-thiazole. One suitable anti-fungal agent is available from Riedel-de Haen under the tradename Mergal® K7. Another suitable anti-fungal agent is FUNGITROL® 158 available from International Specialty Products Company. The anti-fungal agent is generally present in the polymer solution in an amount of 0.5–2 percent by weight.

Triazole or imidazole type compounds preferably useable in the invention include benzotriazoles, benzimidazole, imidazole and histidine. The compounds are generally present in the polymer containing solution in an amount of 0.5–5 percent by weight, more preferably 0.5 to 2 percent by weight.

The polymer solution may further preferably comprise ammonia or other alkali to adjust the pH of the solution to approximately 7–11, preferably 9–10.

The immersion silver plating solution can be used in the processes of the current invention at temperatures ranging from room temperature to 200° F. but is preferably used at from 80 to 120° F. The time for immersion in the plating solution can range from 1 to 30 minutes but is preferably from 1 to 5 minutes.

The immersion or elect4oless silver solution is used to plate a thin layer of silver onto the surface to be soldered. It is believed that the resultant silver coating should be from 1 to 100 micro inches thick, preferably from 10 to 60 micro inches thick for effective enhancement and preservation of the solderability of the surface. Although this process is effective in soldering many surfaces, it is particularly useful in soldering copper surfaces, such as Areas of Connection on printed circuit boards.

After the materials are plated using the immersion or electroless silver plating technique of the invention, they are immersed in the polymer solution for at least 15 seconds and as long as several minutes. The materials are the dried using a technique such as hanging, baking, or blowing. Preferably the polymer solution is operated at room temperature and at a pH from about 8.5–10.5.

Although this technique may be utilized advantageously over almost any surface, it is most useful in the fabrication of printed circuit boards, particularly solder mask over bare copper (SMOBC) boards. Thus, in fabricating SMOBC boards, the solder mask is applied to the surfaces of the board then exposed and developed to reveal the Areas of Connection. These Areas of Connection are then essentially the only exposed areas of copper on the board, with the remainder essentially being covered by solder mask. These exposed Areas of Connection are thus destined to be points of attachment, in most cases by soldering, when the electronic components are later placed on the board later in the fabrication cycle. Therefore, the solderability of these exposed points, generally copper, must be enhanced and preserved.

These areas are preferably cleaned, using an acid cleaner, and subsequently microetched to prepare the surface for acceptable immersion plating. Following this preferred preparation, the board is immersed in the immersion silver plating solution, such that a silver deposit of appropriate thickness is achieved. Subsequently, the board is immersed in the alkaline polymer coating solution of the invention.

The invention is further described for illustrative purposes only in the following examples which are in no way limiting of the invention itself. In each of the examples standard IPC-B-25 test circuit boards are utilized in order to provide consistency. IPC-B-25 standard is incorporated herein by reference in its entirety.

EXAMPLE I

A polymer coating solution of the invention is prepared as follows:
1. DP6-4586™ (available from Allied Colloids Limited) is added to a tank and stirring is commenced;
2. GLASCOL® (available from Allied Colloids) is added to the tank with stirring;
3. Mergal™ (available from Riedel-deHaen) solution is added to the tank with stirring;
4. Irgamet™ (available from Ciba Geigy) is added to the tank with stirring;
5. Ammonia is added to the tank to a pH of 9–10 and the mixture is stirred for at least one hour; and
6. Demineralized water is added to the mixture, making sure that all of the solids are fully dissolved and the mixture is uniform. Stirring is continued for at least 30 minutes.

A series of silver test baths were run. Observations were made on tarnish resistance and solderability, both qualitatively and quantitatively. The boards were kept in a sulfur chamber for 2.5 hours. Tarnish was observed visually then quantitatively by Sequential Electrochemical Reduction Analysis (SERA). Solderability was determined using a wave soldering machine. The results are presented in Table 1.

TABLE 1

Qualitative and Quantitative Determination of Tarnish Resistance and Solderability

| Sample | Visual Tarnish | Total Tarnish (angstroms) | Percent Solderability | Wetability |
|---|---|---|---|---|
| Immersion Silver control | Blue and iridescent | Over 2000 | 100 | De-wetting |
| Immersion Silver with Post-dip | Silver | Less than 50 | 100 | Uniform wetting |

Studies were undertaken to determine the optimum concentration of the polymer bath and to develop an efficient test to verify that the alkaline polymer coating is on the substrate and functioning. 2-inch by 2-inch standard silver plated coupons were used. The processed coupons with the polymer coating and one control (silver plated coupon, no alkaline polymer coating) were processed through a sulfur chamber for 1.5 hours. The results are presented in Table 2.

TABLE 2

Optimum Concentration of the Alkaline Polymer Coating Bath

| Polymer Coating Bath (Concentration, %) | Sulfur Chamber (Time = 1.5 hours) Blown Dry | 10–20% Iron Chloride Solution (IPC Tarnish Test) (20 seconds-10 minutes) |
|---|---|---|
| 1% | Slight tarnish | |
| 5% | O.K. | Pass |
| 10% | O.K. | Pass |
| 15% | O.K. | Pass |
| 20% | O.K. | Pass |
| Control, no polymer coating | Severe | Immediately fail |

In addition, samples that sat in a sulfur chamber for 24 hours were soldered and placed back into the sulfur chamber for an additional 24 hours. The control sample came out with tarnish, while the polymer coated panel was unchanged. Both samples soldered 100% and after the second 24 hour period, the alkaline polymer coated panel remained unchanged, while the control panel showed additional tarnish.

What is claimed is:

1. A process for improving the resistance of a metal surface to electromigrate, while maintaining the solderability of the metal surface, comprising the steps of
   a) contacting the metal surface with an immersion or electroless silver plating solution thereby producing silver plate upon the metal surface; and
   b) thereafter contacting the silver plated surface with a polymer coating solution comprising a material selected from the group consisting of vinyl copolymers, acrylic copolymers, vinyl polymers, acrylic polymers, and mixtures of the foregoing;
   wherein the silver plate has a lower tendency to electromigrate than the same silver plate without the treatment of step (b).

2. A process according to claim 1, wherein the metal surface comprises copper.

3. A process according to claim 1, wherein the vinyl copolymer or vinyl polymers are present in the solution in an aggregate amount of 20–50 percent by weight.

4. A process according to claim 1, wherein the vinyl copolymer or vinyl polymers are present in the solution in an aggregate amount of 30–45 percent by weight.

5. A process according to claim 1, wherein the acrylic copolymer or acrylic polymers are present in the solution in an aggregate amount of 5–30 percent by weight.

6. A process according to claim 1, wherein the acrylic copolymer or acrylic polymers are present in the solution in an aggregate amount of 30–45 percent by weight.

7. A process according to claim 1, wherein the coating solution also comprises a compound selected from the group consisting of triazoles, imidazoles and combinations of the foregoing.

8. A process according to claim 7, wherein the triazole or imidazole compound is selected from the group consisting of benzotriazole, benzimidazole, imidazole, histadine and combinations of the foregoing.

9. A process according to claim 7, wherein the triazole or imidazole compound is present in the solution in an amount of 0.5–5 percent by weight.

10. A process according to claim 1, wherein the polymer coating solution further comprises ammonia.

* * * * *